US011723143B1

(12) United States Patent
Choi et al.

(10) Patent No.: US 11,723,143 B1
(45) Date of Patent: Aug. 8, 2023

(54) THERMAL DISSIPATION AND SHIELDING IMPROVEMENT USING MERGED PCB BOTTOM COPPER POST

(71) Applicant: Avago Technologies International Sales Pte. Limited, Singapore (SG)

(72) Inventors: Chang Kyu Choi, Fremont, CA (US); Hyun Mo Ku, Seoul (KR); Sarah Kay Haney, San Jose, CA (US); Li Sun, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/730,856

(22) Filed: Apr. 27, 2022

(51) Int. Cl.
*H05K 1/02* (2006.01)

(52) U.S. Cl.
CPC ... *H05K 1/0209* (2013.01); *H05K 2201/0364* (2013.01); *H05K 2201/062* (2013.01); *H05K 2201/094* (2013.01); *H05K 2201/09418* (2013.01); *H05K 2201/10098* (2013.01); *H05K 2201/10318* (2013.01)

(58) Field of Classification Search
CPC ..... H05K 1/0209; H05K 1/021; H05K 1/0203
See application file for complete search history.

(56) References Cited

U.S. PATENT DOCUMENTS

| 5,726,502 | A  | 3/1998  | Beddingfield     |
| 7,932,601 | B2 | 4/2011  | Chang et al.     |
| 9,159,589 | B2 | 10/2015 | Lin et al.       |
| 9,252,120 | B2 | 2/2016  | Nah et al.       |
| 9,997,466 | B2 | 6/2018  | Vogt et al.      |
| 10,242,937| B2 | 3/2019  | Sato et al.      |
| 11,088,102| B2 | 8/2021  | Cha et al.       |
| 11,114,359| B2 | 9/2021  | Belonio, Jr. et al. |
| 11,233,025| B2 | 1/2022  | Gu et al.        |

*Primary Examiner* — Jeremy C Norris
(74) *Attorney, Agent, or Firm* — Quarles & Brady LLP

(57) ABSTRACT

A system and method for dissipating heat from a package and reducing interference between signaling pins is disclosed. The system includes a circuit substrate that includes a dielectric layer and at least one metal layer having an external surface. A plurality of metal posts is disposed on the external surface that function to a least one of dissipate heat from the circuit substrate, shield interfering signals between the signaling pins, and interact with mounting substrates on corresponding componentry. One or more metal posts are merged, increasing the interference shielding and heat dissipation functions of the metal posts.

20 Claims, 10 Drawing Sheets

THERMAL DISSIPATION AND SHIELDING IMPROVEMENT USING MERGED PCB BOTTOM COPPER POST

BACKGROUND

Communication devices, such as smartphones, continually undergo redesign processes to increase functionality, with the goal of the increased functionality not increasing form factor size. However, many RF components in communication devices generate heat that can initially lead to degraded RF performance (e.g., such as insertion loss, and losses of gain and power efficiency) and can eventually lead to whole system failure. Devices redesigned with increased functionality per form factor size are at particular risk for overheating, and current heat, and current thermal dissipation solutions may not effectively prevent overheating in these devices. Furthermore, increased componentry/energy density in communication devices may also lead to increased interference between device components, for which current shielding designs may not be able to effectively prevent cross-talk between these components. Accordingly, it is desirable to provide a thermal and RF shielding systems that electively reduce thermal and RF effects in current and future designs.

SUMMARY

A system that includes a package is disclosed. In one or more embodiments, the package includes a circuit substrate. In one or more embodiments, the circuit substrate includes a dielectric layer and a first metal layer disposed upon a first side of the dielectric layer and configured with a first external surface. In one or more embodiments, the circuit substrate further includes a plurality of metal posts disposed on the first external surface. In one or more embodiments, the plurality of metal posts includes a merged set of at least two metal posts configured to block interfering signals between a first signal pin and a second signal pin and to dissipate heat from the circuit substrate. In one or more embodiments, the plurality of metal posts further includes a mounting set of metal posts configured to mount the package.

In some embodiments of the system, the system further includes a second metal layer disposed on a second side of the dielectric layer. In some embodiments, the system further includes internal circuitry configured to transmit electrical signals between the first metal layer and the second metal layer.

In some embodiments of the system, one or more metal posts of the plurality of metal posts is configured with a width within a range between 40 μm and 200 μm. In some embodiments of the system, one or more metal posts of the plurality of metal posts is configured with a height within a range between 30 μm and 200 μm. In some embodiments of the system one or more metal posts of the plurality of metal posts is configured with a minimum length within a range between 30 μm and 100 μm.

In some embodiments of the system, the merged set of metal posts is configured as an L-shape. In some embodiments of the system, the merged set of metal posts is configured as a cruciform shape. In some embodiments of the system, the merged set of metal posts is configured as a block shape.

In some embodiments of the system, the system further includes a transceiver, wherein the package is integrated within the transceiver. In some embodiments of the system, the system further includes a mobile communication device, wherein the semiconductor is integrated within the mobile communication device.

A method is also disclosed. In one or more embodiments the method includes preparing an external surface of a circuit substrate for placement of a plurality of metal posts. In one or more embodiments, the method further includes placing the plurality of metal posts on the external surface of a circuit substrate. In one or more embodiments, the method further includes forming a first signaling pin and a second signaling pin on the external surface. In one or more embodiments, the method further includes merging two or more metal posts of the plurality of metal posts to increase shielding between the first signaling pin and the second signaling pin and increase thermal dissipation from the circuit substrate. In one or more embodiments, the method further includes coupling the package to electronic componentry via one or more of the plurality of metal posts.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
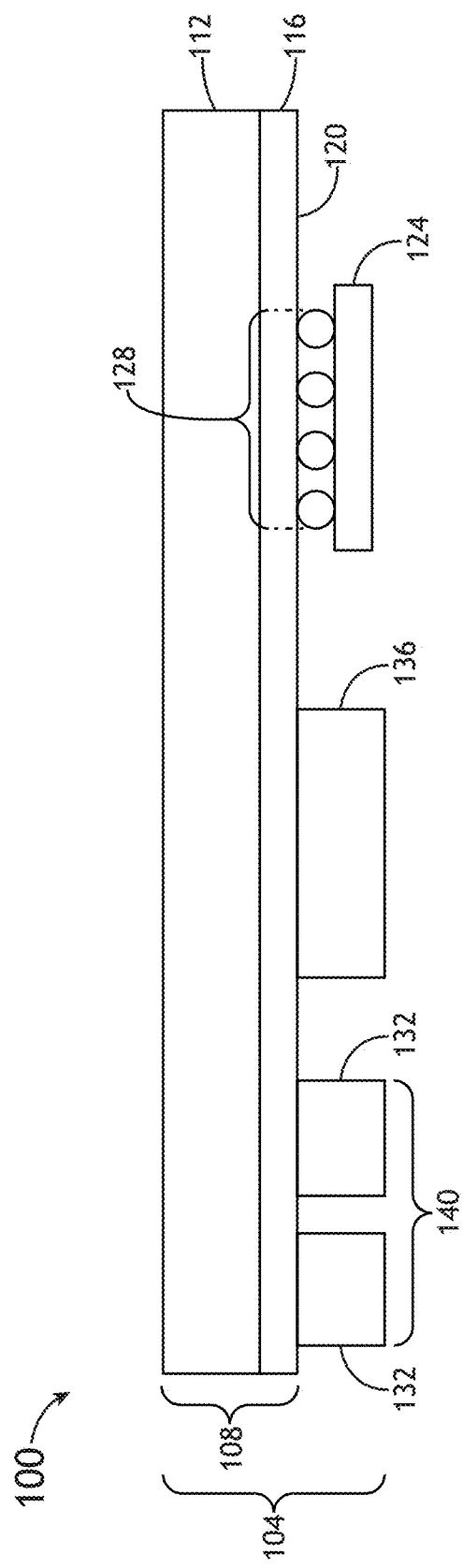
FIG. 1 is a block diagram illustrating a side view of a system comprising a package, in accordance with one or more embodiments of the disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

A package comprising a circuit substrate is disclosed. The circuit substrate includes at least one dielectric layer, at least one external copper layer. And a plurality of copper posts coupled to the at least one external copper layer. A set of the copper posts may be used for mounting. At least one set of copper posts is merged, which increases the ability of the copper posts to block interfering RF signals between two signal pins.

FIG. 1 is a block diagram illustrating a system 100 comprising a package 104, in accordance with one or more embodiments of the disclosure. The package 104 may be a part of, or may include, multiple components that comprise an electronic system. For example, the package may be configured as, or may be included within, a system-in-package (SiP), an SiP package, or an SiP module.

The package 104 includes a circuit substrate 108 that comprises at least one dielectric layer 112 and at least one metal layer 116 (e.g., a first metal layer or last metal layer). The metal layer 116 may itself may include multiple metal sublayers. The circuit substrate 108 may be configured as any type of circuit-containing substrate or circuit board including but not limited to a printed circuit board (PCB) or a printed wiring board (PWB). For example, the circuit substrate 108 may be configured as any type of PCB including but not limited to single layer PCBs, double layer PCBs, multi-layer PCBs, high-density interconnect (PCBs), rigid PCBs, flex PCBs, and rigid-flex PCBs. For instance, the circuit substrate 108 may be configured as a double layer PCB, similar to those used in double-sided molded ball grid array (DSMBGA) platforms.

The circuit substrate 108 may be configured with any number of dielectric layers 112 and made of any type of dielectric material including but not limited to porcelain, mica, glass, plastic, and metal oxides. The circuit substrate 108 may be configured with any number of metal layers and include any metal, including but not limited to copper. The circuit substrate 108 may be configured as either a core or coreless circuit substrate. The metal layer 116 includes an external surface 120 (e.g., a first external surface) that provides a mounting surface for electronic componentry mounted to the circuit substrate 108 such as microprocessor 124 or RF components. For example, the microprocessor 124 may be mounted to the external surface 120 via microbumps 128. In some embodiments, the circuit substrate 108 does not include a dielectric layer 112.

In embodiments, the package 104 includes a plurality of metal posts 132 physically coupled to the external surface 120, the metal layer 116 and/or the dielectric layer 112. The metal posts 132 perform functions that include at least one of providing a mounting point for the circuit substrate 108 (e.g., a mounting set of one or more metal posts 132 for mounting the package 104 to a corresponding solder ball or other mounting substrate), providing thermal dissipation for the circuit substrate 108, and/or blocking interfering signals between circuit substrate componentry. For example, the metal posts 132 may be electrically coupled to the metal layer 116 For instance, the metal posts may be configured as a ground post providing a return path for electric current. In another example, the metal posts 132 may be physically coupled to the dielectric layer and electrically isolated from the external surface 120 (e.g., for use as a signaling pin). In another example, the metal posts 132 are not disposed upon the dielectric layer. In another example, the metal posts 132 may be used only for mounting and have no electrical purposes (e.g., a dummy post).

The mounting set of metal posts 132 may include any set of metal posts 132 on the circuit substrate 108 that participate in bonding the circuit substrate to another substrate, such as BGA package. For example, the mounting set of metal posts 132 may bind to solder balls on the BGA package, providing the cohesive linkage between the circuit substrate 108 and the BGA package. The mounting set of metal posts 132 may include all of the metal posts 132 on the circuit substrate, and may include metal substrates that are also used for thermal dissipation and interfering signal-blocking functions.

The metal posts 132 may be of any number and made of any type of metal. For example, the metal post 132 may be primarily constructed of copper. In another example, the metal posts may be plated with a metal finish (e.g., gold/silver/tin) or coated with a non-metal finish (e.g., Organic Solderability Preservative (OSP)). In embodiments, the two or more metal posts 132 may be merged, creating a merged set 136 of metal posts 132. Merged sets 136 of metal posts 132 have enhanced thermal dissipation and interference blocking qualities over non-merged sets 140 of metal posts 132, as described herein. For example, the merged sets 136 have enhanced thermal dissipation qualities that facilitate the removal of heat from the circuit substrate 108 or other substrates. The metal posts 132 may be formed by any process including deposition processes including but not limited to any plating, physical vapor deposition processes, chemical vapor deposition processes, sputtering, extrusion, and epitaxy. The metal posts 132 may also be formed via any removal processes such as etching. The metal posts 132 may also be pre-formed and attached to the external surface 120 via adhesive, mechanical, or welding processes.

The merged set 136 of metal posts 132 may include any metal posts 132 having an increased dimension (e.g., width, or length) that has the appearance of a merged post. For example, the merged set 136 of metal posts 132 may include a single post configured an increased dimension. For example, the merged set 136 of metal posts 132 may include a single metal post 132 having a width twice the length of a typical single metal post 132 (e.g., or greater) within the circuit substrate 108. In another example, the merged set 136 of metal posts 132 include a metal post having a width 1.5 times the length of a typical single metal post 132 within the circuit substrate 108. The merged set 136 of metal posts 132 may also include any number of metal posts 132 that have been merged or incorporated together (e.g., constructed as a single post). For example, the merged set 136 may incorporate two metal posts 132, may incorporate three posts 132, may incorporate four metal posts 132, or may incorporate five or more metal posts 132.

The merged set 136 of metal posts 132 may be constructed in any manner using any strategy. For example, the merged set 136 of metal posts 132 may be constructed as a single monolithic metal post 132. For instance, the merged set 136 of posts 132 may be formed independently and bonded to the circuit substrate 108 (e.g., the external surface 120). In another instance, the merged set 136, configured as a single monolithic metal post 132, may be formed directly on the external surface 120 via an additive manufacturing method, that may include any metal layering method including but not limited to metal binder jetting and directed energy deposition. In another example, the merged set 136 of metal posts 132 may be constructed though the initial placement of two or more metal posts 132 on the external surface 120, then filling in the space between the metal posts 132 via an additive manufacturing method.

Figure 2:
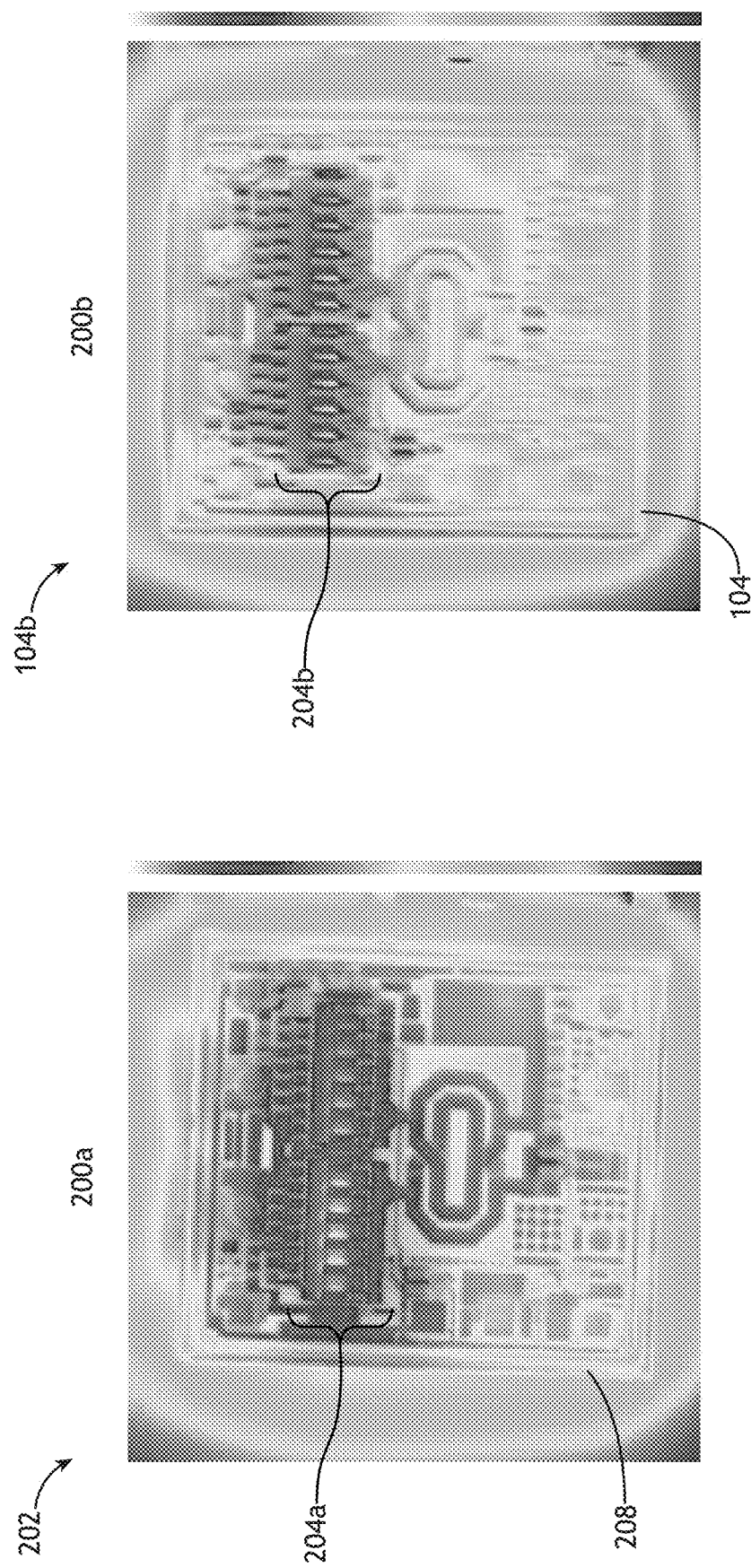
FIG. 2 are heat maps of a double-sided circuit substrate with solder balls and metal posts, in accordance with one or more embodiments of the disclosure.

Metal posts 132, particularly copper posts, have been shown to have enhanced thermal dissipation qualities over traditional mounting technology, such as solder balls, as demonstrated in heat maps 200a-b of circuit substrate illustrated in FIG. 2, in accordance with one or more embodiments of the disclosure. Enhanced thermal dissipation decreases overall heat-heated stresses to electronic circuitry, such as portions of the circuit substrate 108 and over time can contribute to a lengthening of time that the circuit substrate continues to function correctly. As shown in FIG. 2, the heat map 200a of a double-sided non-metal post-containing circuit substrate 202 with a row 204a of electrically coupled solder balls (DSMBGA 208) present a large area having the highest temperature range, whereas a similarly designed package 104 configured with a row 204b of metal posts 132 presenting a cooler heat profile than the row 204a of solder balls.

Temperature differences of approximately 20° C. and thermal resistance differences of approximately 8.0° C./W at have been recorded at the junction sites of solder balls and metal posts 132 within the row 204a-b of junctions. For example, when both circuit substrates 108, 202 are powered (e.g., Vcc=5.54V), the average temperature of a junction at the non-metal post-containing circuit substrate 202 is 203.7° C., whereas the average temperature of a junction at the circuit substrate 108 is 184.7° C. In another example, when both circuit substrates 108, 204 are powered, the average thermal resistance of a junction at the non-metal post-containing circuit substrate 202 is 49.7° C./W, whereas the average temperature of a junction at the circuit substrate 108 is 42.2° C./W.

It is noted that FIG. 2 demonstrates the use of single, unmerged metal posts 132. It is predicted that a circuit substrate 108 comprising a merged set 136 of metal posts 132 will have enhanced thermal dissipation characteristics (lower average junction temperature and lower thermal resistance) verses a circuit substrate 108 comprising non-merged metal posts 132. For example, a merged set 136 of metal posts 132 may demonstrate an average junction temperature of less than 184° C., less than less than 180° C., less than 175° C., less than 170° C., less than 165° C., less than 160° C., less than 155° C., less than 150° C., or less than 140° C. when powered. For instance, a merged set 136 of metal posts 132 may demonstrate an average junction temperature that is more than 1° C., more than 2.5° C., more than 5° C., more than 10° C. or more than 20° C. lower than a similarly designed and/or oriented metal post 132 or unmerged set 140 of metal posts 132 operated under similar conditions.

In another example, a merged set 136 of metal posts 132 may demonstrate an average thermal resistance of less than 42° C./W, less than 41° C./W, less than 40° C./W, less than 35° C./W, or less than 30° C./W when powered. For instance, a merged set 136 of metal posts 132 may demonstrate an average thermal resistance that is more than 1° C./W, more than 2° C./W, more than 4° C./W, more than 8° C./W, or more than 10° C./W lower than a similarly designed and/or oriented metal post 132 or unmerged set 140 of metal posts 132 operated under similar conditions.

Figure 3A:
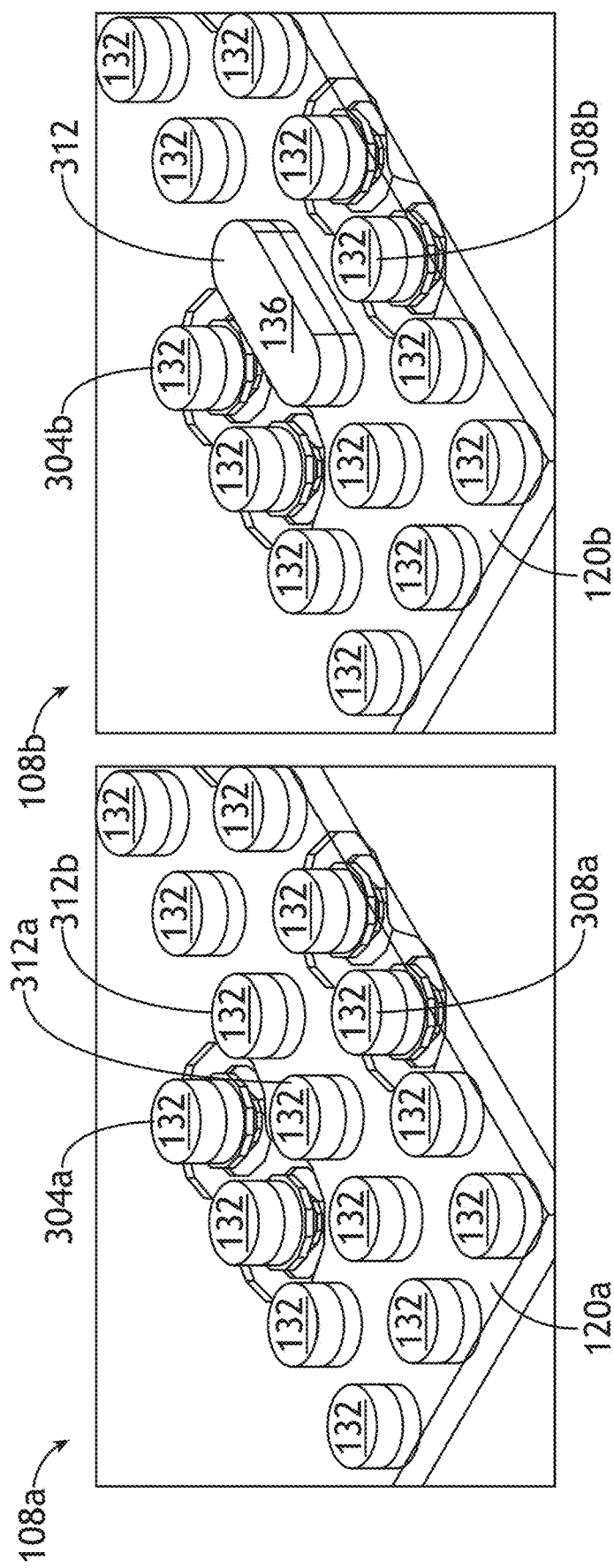
FIG. 3A illustrates the external surfaces of two circuit substrates, each coupled to a plurality of metal posts, in accordance with one or more embodiments of the disclosure.
Figure 3B:
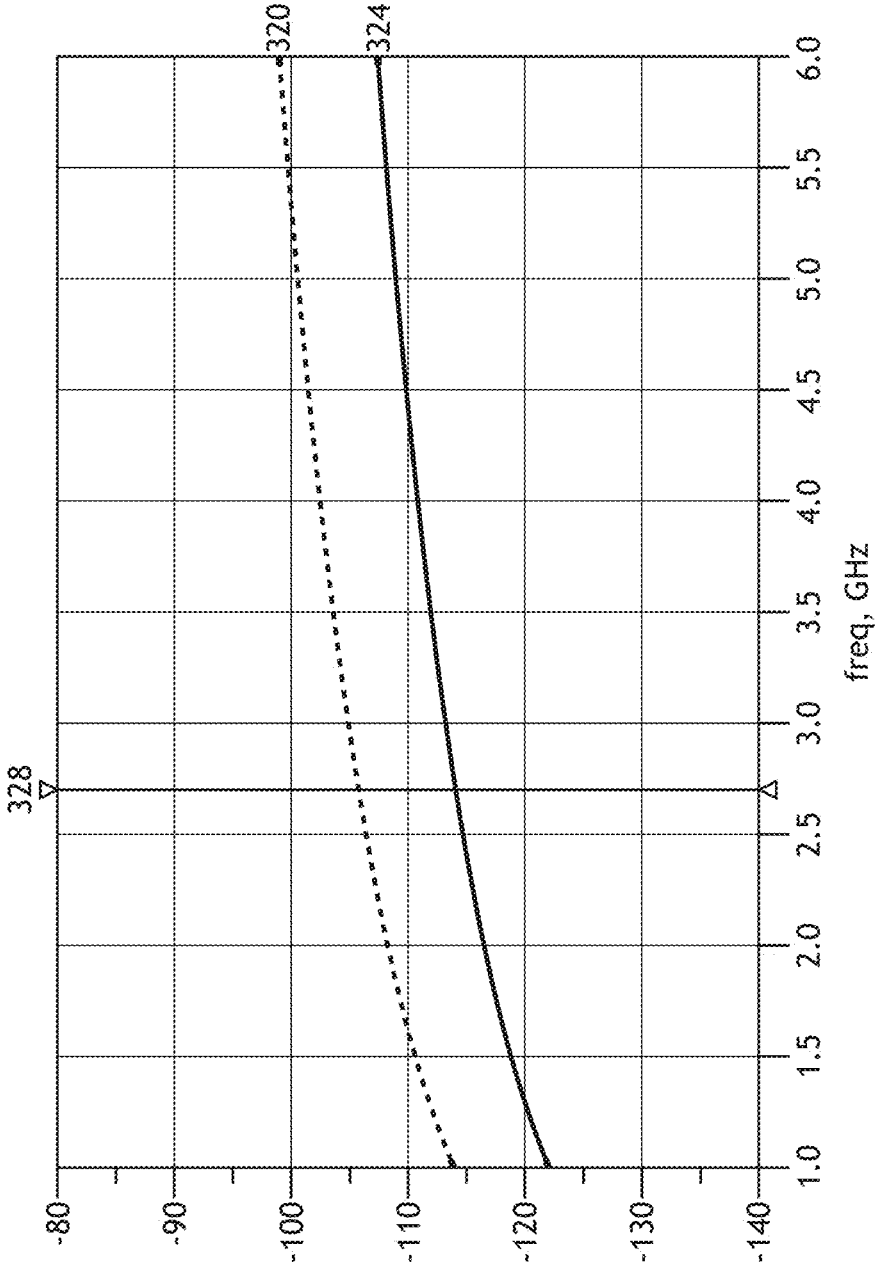
FIG. 3B. illustrates a graph describing a result of a simulated interference of signaling pins, in accordance with one or more embodiments of the disclosure.

The enhanced ability of a merged set 136 of metal posts to block interference between RF emitting bodies is demonstrated in FIGS. 3A-B, in accordance with one or more embodiments of the disclosure. FIG. 3A illustrates the external surfaces 120a-b of two circuit substrates 108a-b, each coupled to a plurality of metal posts 132, in accordance with one or more embodiments of the disclosure. Two metal posts 132 from each circuit substrate 108a-b are also configured as a first signaling pin 304a-b and a second signaling pin 308a-b, respectfully. The first signaling pin 304a-b and the second signaling pin 308a-b may each carry signal (e.g., an RF signal) which also interferes with the carried signal of the respective other pin. In circuit substrate 108a, two grounded metal posts 312a-b (e.g., power-on reset (POR) pins) partially block the interference between the first signaling pin 304a and the second signaling pin 308a. In circuit substrate 108b, a grounded merged set 136 of metal posts 312 (e.g., shaped as a rounded bar) provides a more substantial interference block between the first signaling pin 304b and the second signaling pin 308b (e.g., merging the metal posts 312 increases the ground wall, which acts as an isolation wall between the first signaling pin 304b and the second signaling pin 308b.

Simulated interference blocking studies are shown in a graph 316 in FIG. 3B. Results of simulated interference testing of circuit substrate 108a (e.g., with non-merged metal posts 132) is represented by line 320. Results of simulated interference testing of circuit substrate 108b (e.g., with the merged set 136 of metal posts 132) represented by line 324. As shown in the graph 316, the merged set 136 of metal posts 132 reduced interference as compared to separated metal posts 132. For example, at 2.7 GHz, represented by line 328, the circuit substrate 108a presented an interference value of ~106 dB, whereas the circuit substrate 108b presented a lower interference value of −114. These increases in measured interference may allow further increases in component density/power within a similarly constrained volume, increasing overall power and/or function of the package 104.

The merged set 136 of metal posts 132 may demonstrate a variety of shielding abilities (e.g., reducing background interference) and may show specific shielding abilities that are greater than shielding abilities demonstrated by a similarly designed and/or oriented non-merged set 140 of metal posts 132 operating under similar conditions. For example, the merged set 136 of metal posts 132 may demonstrate reduce interfering noise to −115 dB or less (e.g., less meaning a greater negative dB value), to −120 dB or less, to −125 dB or less, to −130 dB or less, to −135 dB or less, or to −140 dB or less. In another example, the merged set 136 of metal posts 132 may demonstrate an improvement in interference noise reduction over a similarly designed and/or oriented non-merged set 140 of metal posts 132 operating under similar conditions. For instance, the merged set 136 of metal posts 132 may demonstrate greater than a 1 dB, greater than a 2.5 dB, greater than a 5 dB, greater than a 10 dB, or greater than a 20 dB increase in reduction of interfering noise over a similarly designed and/or oriented non-merged set 140 of metal posts 132 operating under similar conditions.

Figure 4:
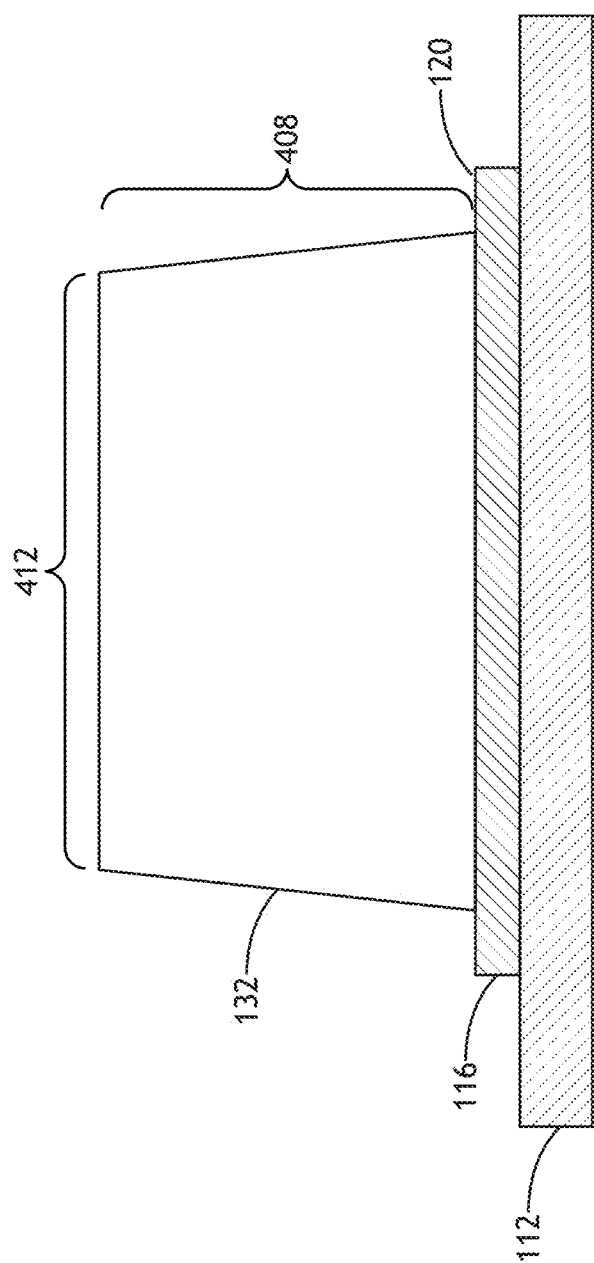
FIG. 4 is a diagram of a metal post disposed upon a metal layer, in accordance with one or more embodiments of the disclosure.

FIG. 4 is a diagram of a metal post 132 disposed upon an external surface (e.g., metal layer 116), in accordance with one or more embodiments of the disclosure. The disposition of the metal post 132 to the external surface 120, such as the metal layer 116, may be direct or indirect. For example, the metal post 132 may be disposed directly onto the metal layer 116 (e.g., the metal post 132 bonded to the metal layer 116). In another example, the metal post 132 may be bonded to a conductive pad that is bound to the external surface 120. For instance, the metal posts 132 are disposed on the conductive pad, which is then disposed on top of the dielectric layer. In this manner, an indirect disposition of the metal post 132 to the external surface 120 may include several layers (e.g., intervening elements), one of which may include a conductive pad or other substrate.

The metal post 132 is configured with a height 408 with ranges that include but are not limited to ranges between 1 μm and 6000 μm, between 5 μm and 1200 μm., between 10 μm and 600 μm, between 20 μm and 400 μm, between 30 μm and 200 μm, and between 40 μm and 100 μm. For example, the height 408 of the metal post 132 may be approximately 120 μm. The metal post 132 is also configured with a length 412 that has no maximal limit, as multiple metal posts 132 can be merged. The minimum length 412 of the metal post 132 may be configured between 1 μm and 300 μm, between 5 μm and 150 μm, between 10 μm and 100 μm, between 30 μm and 100 μm, or between 50 μm and 100 μm. For example, the metal post 132 may have a length of approximately 170 μm. As the merged set 136 may be merged with many turns, such as in a spiral configuration, the merged set 136 may have a length longer than a length of the circuit substrate 108. For example, a merged set 136 may have a length of approximately 750 μm. In another example, a merged set 136 may have a length of approximately 1000 μm. In another example, a merged set 136 may have a length of approximately 2000 μm. In another example, a merged set 136 may have a length of approximately 5000 μm.

Figure 5:
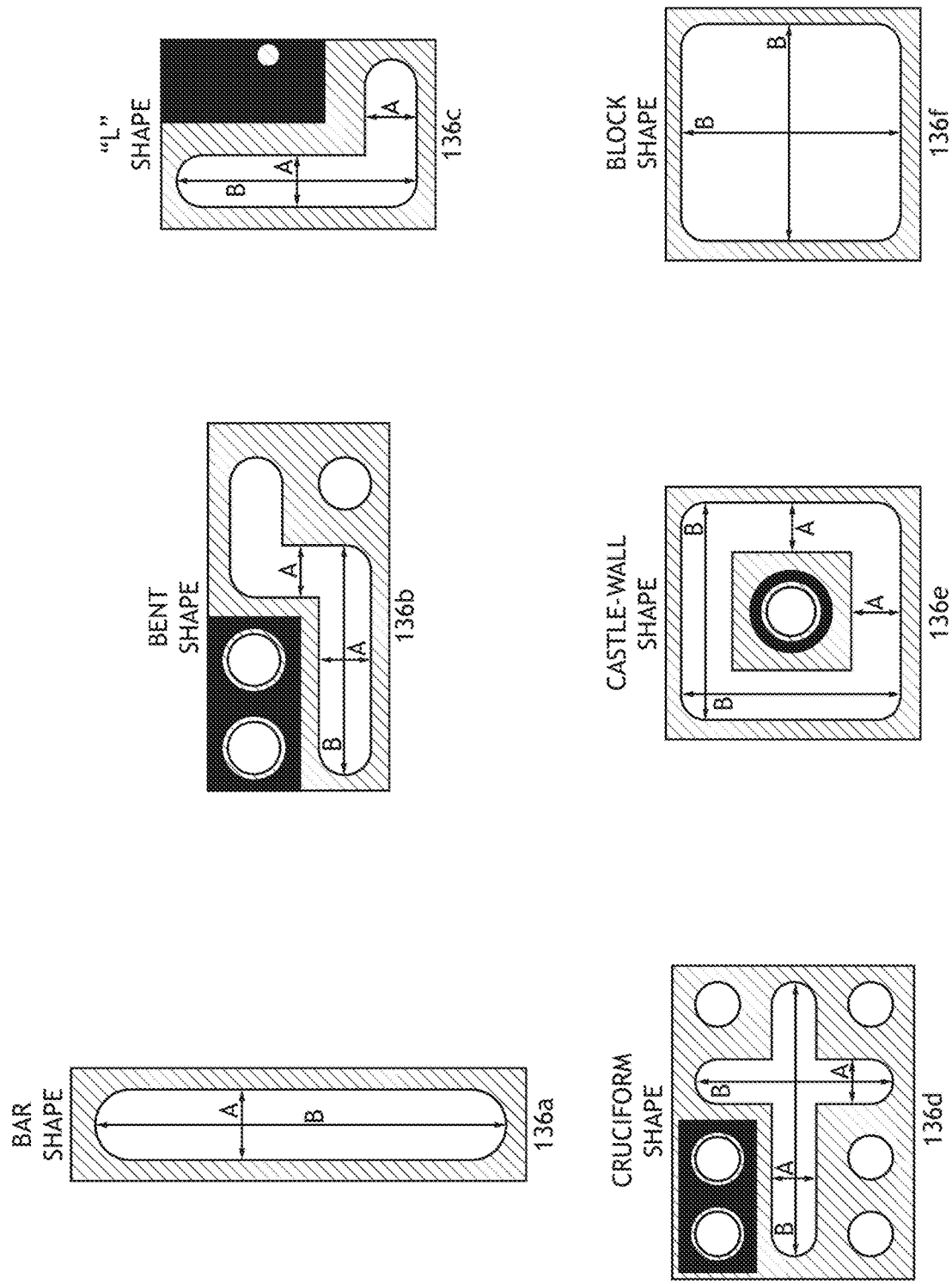
FIG. 5 is a series of diagrams illustrating types of merged posts, in accordance with one or more embodiments of the disclosure.

The metal post 132 is also configured with a width (e.g., as shown in FIG. 5) that may be configured within a range between 1 μm and 1000 μm, between 5 μm and 750 μm, between 10 μm and 500 μm, between 20 μm and 500 μm, between 40 μm and 500 μm, between 50 μm and 500 μm, between 75 μm and 300 μm, between 40 μm and 200 μm and between 100 and 200 μm. For example, the metal post 132 may be configured with a width of approximately 100 μm. In another example, the metal post 132 may have a width of approximately 170 μm. The metal posts 132 are capable of mounting with other componentry via bonding a corresponding mounting medium, such as a solder ball. Metal posts 132 can be assembles into a circuit substrate 108 with footprints (e.g., pitches) considerably smaller than traditional solder balls, such as those for ball grid arrays (BGAs), which are often configured with pitches of approximately 365 μm. For example, the metal posts 132 may be assembled onto a circuit substrate 108 with a pitch of approximately 280 μm.

FIG. 5 is a diagram of illustrating the different shapes of merged metal posts 132 (e.g., merged set 136) that may be utilized by the package 104, in accordance with one or more embodiments of the disclosure. For example, the merged set 136 of metal posts 132 may be configured with a bar shape (e.g., merged set 136a), a bent shape resembling a skew tetromino and having a general "Z" or "S" form (e.g., merged set 136b), an "L" shape (e.g., merged set 136c), a cruciform shape (e.g., merged set 136d), a castle-wall or hollow block shape (e.g., merged set 136e) that may surround a first signaling pin 304, and a block shape (e.g., merged set 136f). The merged set 136 may include any other types of shapes, any combinations of shapes, and any number of metal posts 132. For example, the merged set 136 may include more than 30 merged metal posts 132 arranged in a ribbon fashion along the external surface 120. The merged set 136 may also incorporate the merging of adjacent metal posts 132 that are diagonally arranged (e.g., the merged set 136 not limited to merging of posts in a strict X-axis and/or Y-axis, as shown in FIG. 5).

Figure 6:
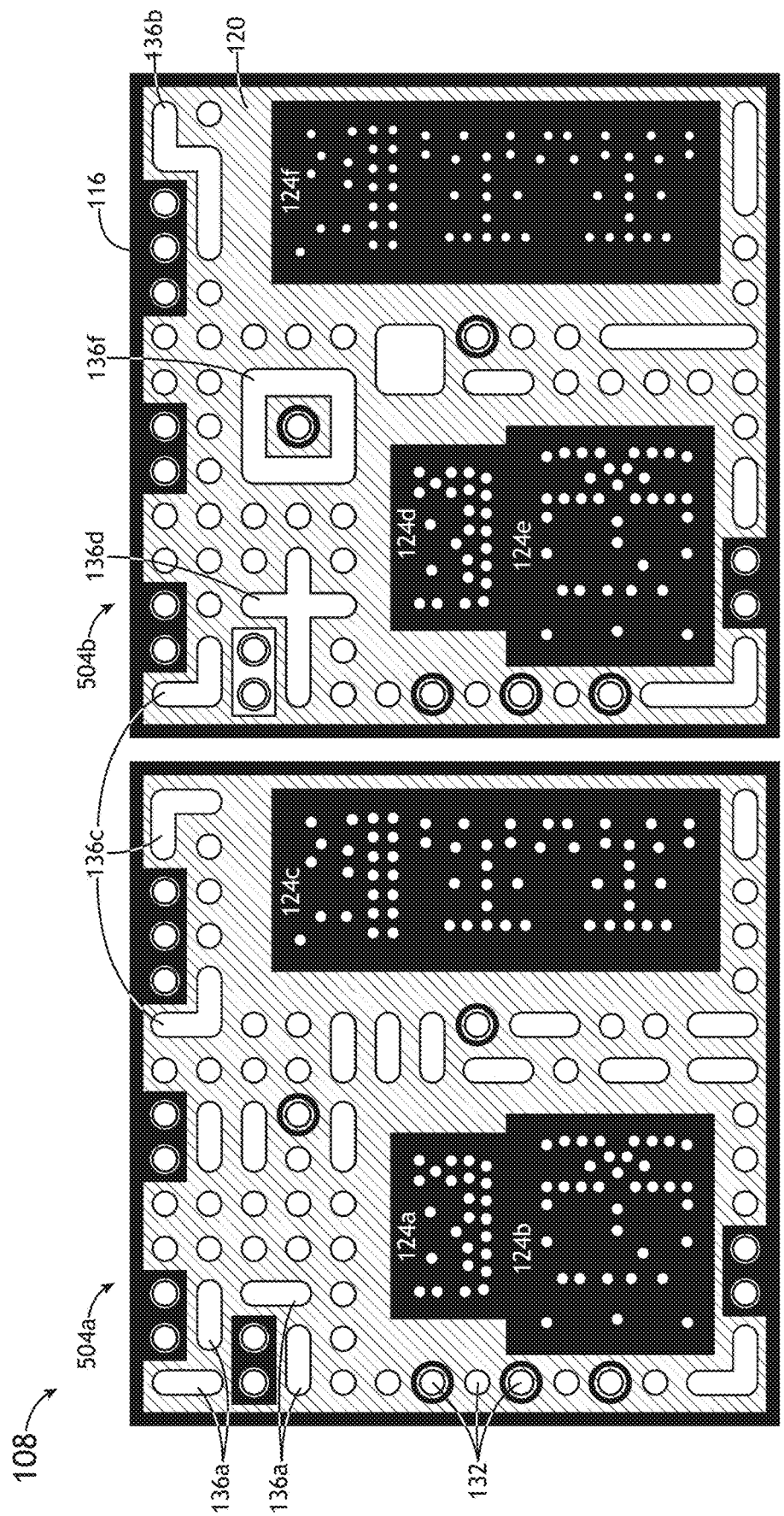
FIG. 6 is a diagram illustrating a reverse-pan view of two sections of a circuit substrate, in accordance with one or more embodiments of the disclosure.

FIG. 6 is a diagram illustrating a reverse-pan view of two sections 504a-b of a circuit substrate 108, in accordance with one or more embodiments of the disclosure. The view demonstrates the external surface 120 of the metal layer 116, with some portions removed to reveal the dielectric layer 112. Several merged sets 136 of metal posts 132 and single metal posts 132 are disposed on the external surface 120 as well as several microprocessors 124. Merged sets 136 on disposed on the two sections 504a-b include several bar shapes (e.g., merged set 136a), the bent shape (e.g., merged set 136b), several "L" shapes (e.g., merged set 136c), the cruciform shape (e.g., merged set 136d), a castle wall shape (e.g., merged set 136e), and the block shape (e.g., merged set 136f).

Figure 7:
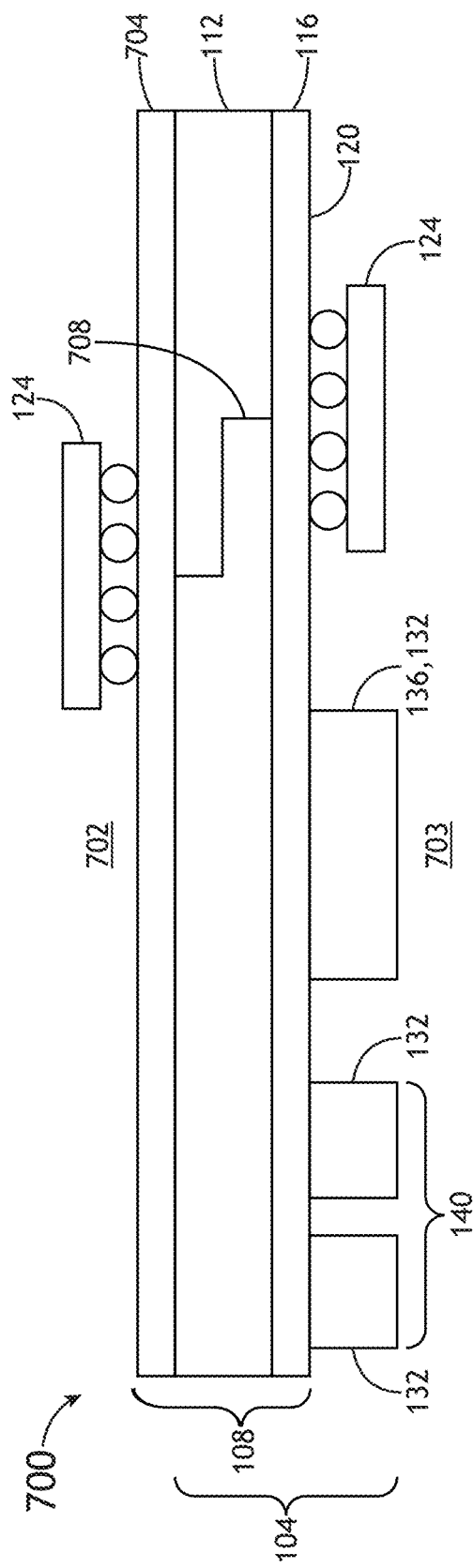
FIG. 7 is a diagram illustrating a side-view of a system comprising a package, in accordance with one or more embodiments of the disclosure.

As discussed herein, the circuit substrate 108 may be configured as a double-sided circuit substrate as shown in package 700 and illustrated in FIG. 7, in one or more embodiments of the disclosure. The double-sided circuit substrate may be configured with a top side 702 and a bottom side 703. The package 700 may contain one or more, or all, components of package 700, and vice versa. For example, the circuit substrate 108 of package 700 may include second metal layer 704. For instance, the second metal layer 704 may be configured as copper layer that, with metal layer 116, envelopes the dielectric layer 112 (e.g., the dielectric layer 112 covered on a first side by an adjacent first metal layer 116 and on a second side by the adjacent second metal layer 704). The dielectric layer 112 may include internal circuitry 708 configured to direct electrical signals between the two metal layers 116, 704. The internal circuitry 708 may be configured with one or more inner metal layers & dielectric layers. The metal posts 132 may be disposed on either the bottom side 703 (e.g., as in FIG. 7), the top side 702, or both.

Figure 8:
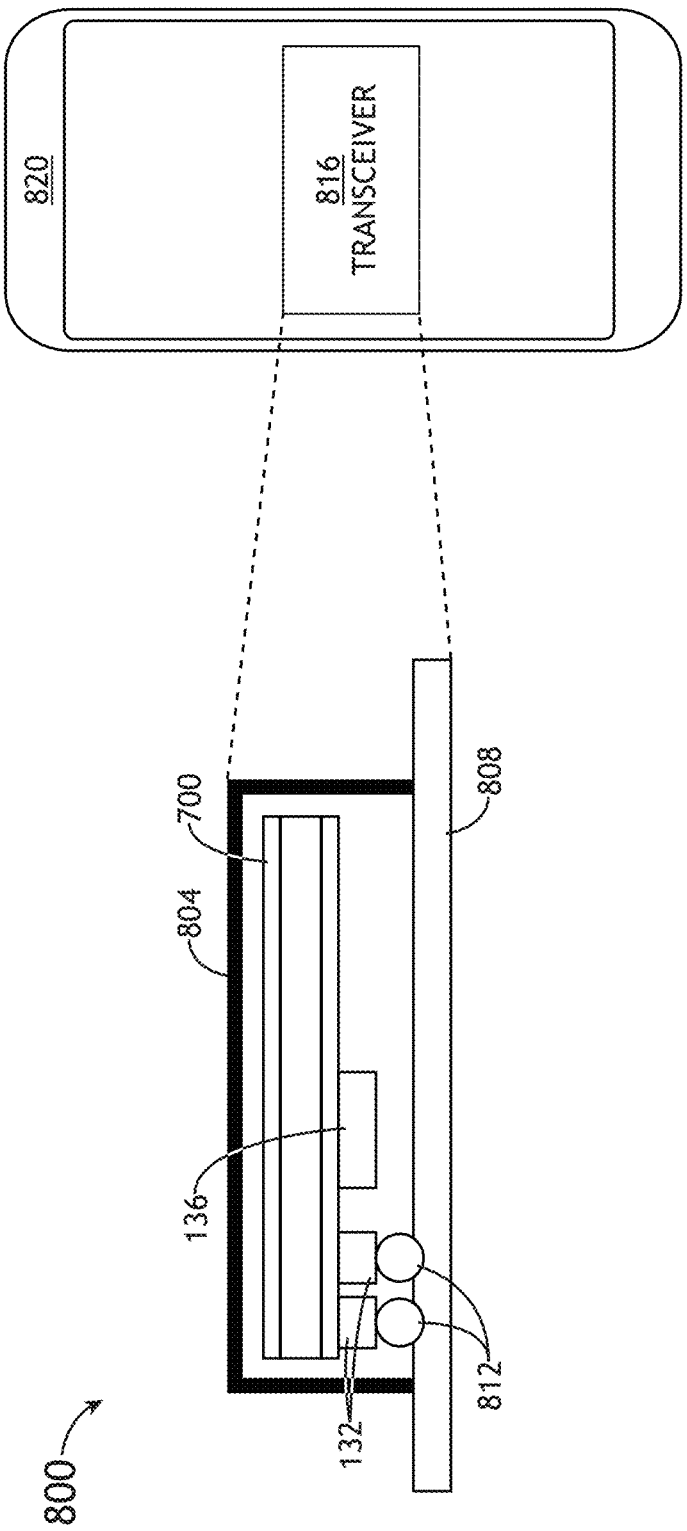
FIG. 8 is a block diagram illustrating a system integrated within a mobile communication device, in accordance with one or more embodiments of the disclosure.

In some embodiments, the system 100, 700 may further include, or be incorporated into, a system 800 having a package housing 804 and/or a motherboard 808, as shown in FIG. 8, in accordance with one or more embodiments of the disclosure. System 800 may contain one or more, or all, components of system 800 and vice versa. For example, the package 700 may be adhered to package housing 804 via an adhesive, an interference fit, or other type of connecting technology. In another example, the package 700 may be coupled to the motherboard 808 via the interaction between one or more metal posts 132 and a set of solder balls 812. In some cases, the metal posts 132 are not used to physically couple to other components, such as the merged set 136 shown in FIG. 8. The system 100, 700 and 800 may include or be incorporated within any electronic componentry including, but not limited to, a transceiver 816. The system 100, 700 and 800 may include or be incorporated within any electronic device including, but not limited to, a mobile communication device 820 (e.g., a smartphone, a tablet, a laptop, a computer, a gaming console, and a smartwatch). Many different configurations of the system 100, 700 and 800 and coupling mechanisms of the system 100, 700 and 800 are possible. Therefore, the description herein is intended not as a limitation of the system 100, 700 and 800, or the package 104, 700, but as an illustration.

Figure 9:
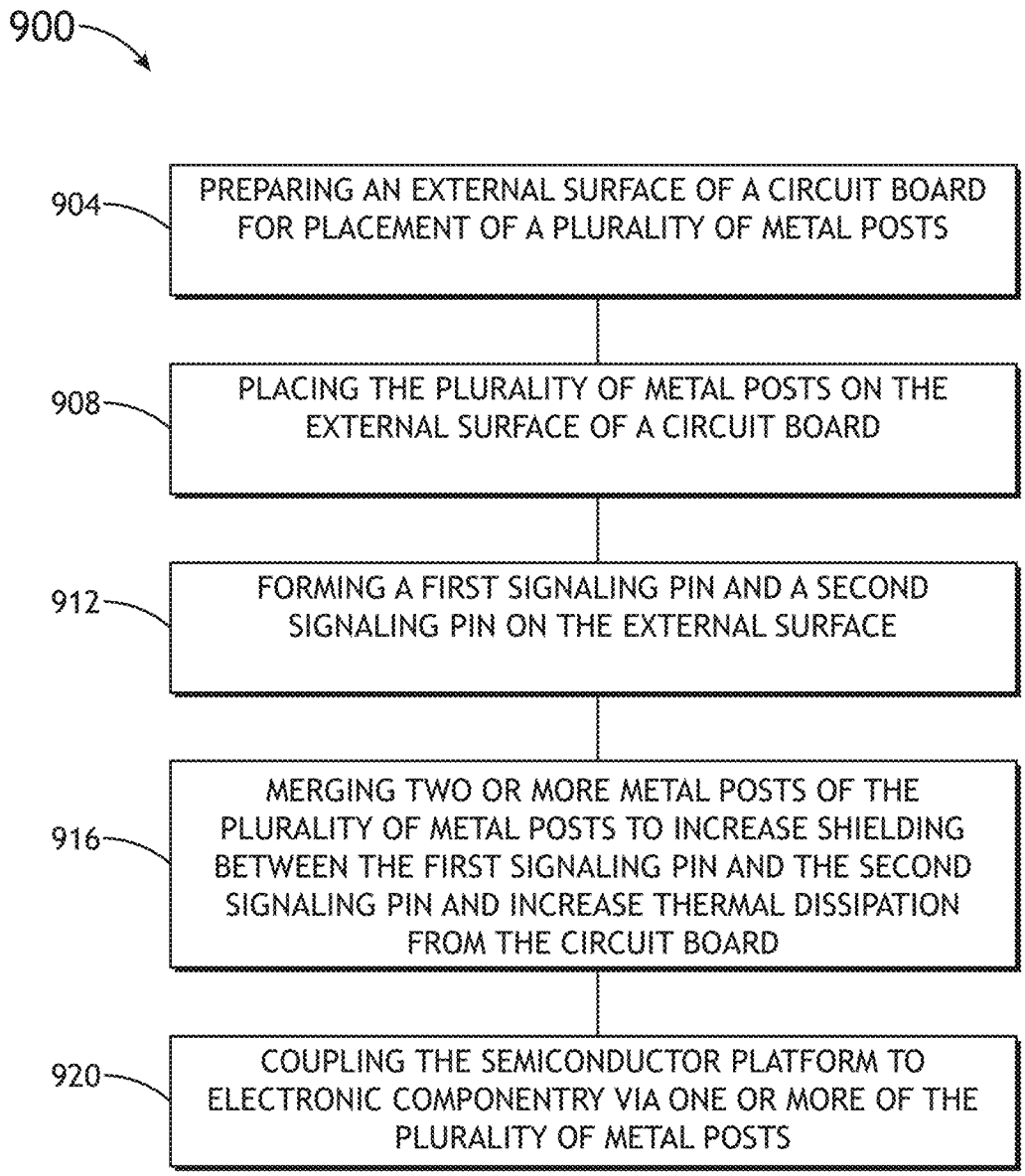
FIG. 9 is a block diagram illustrating a method for dissipating heat from a package and reducing RF interference between a first signaling pin and a second signaling pin, in accordance with one or more embodiments of this disclosure.

FIG. 9 is a block diagram of a method 900 for dissipating heat from a package 104 and reducing RF interference between a first signaling pin 304 and a second signaling pin 308, in accordance with one or more embodiments of this disclosure. The method 900 may be utilized by any type of package 104 as described herein, as well as any type of circuit substrate 108 as described herein. For example, the method 900 may be used for implementing heat dissipation and interference reducing measures in a package 104, 700. For instance, the method 900 may be used for implementing heat dissipation and interference reducing measures in a mobile communication device 820.

In embodiments, the method 900 includes a step 904 of preparing the external surface 120 of a circuit substrate 108 for placement of a plurality of metal posts 132. For example, the step may include drafting a design of for the placement of the plurality of metal posts 132 onto the external surface 120. For example, the design may include an array or grid description of metal post placements, along with indications of merged sets 136 of metal posts 132. The metal posts 132 may be of any type, shape, or size as described herein. For example, the metal posts 132 may comprise copper.

In embodiments, the method 900 further includes a step 908 of placing the metal posts 132 on the external surface 120 of the circuit substrate 108. The placement of the metal posts 132 on the external may be performed by and technology as described herein (e.g., plating, chemical disposition, physical disposition, etching, and/or attachment or preformed metal posts 132).

In embodiments, the method 900 further includes a step 912 of least one of forming a first signaling pin 304 and a second signaling pin 308 on the external surface, or designating two metal posts 132 as the first signaling pin 304 and the second signaling pin 308. The first signaling pin 304 and the second signaling pin 308 may be configured as any type of pin or metal post 132 configured to transmit a signal, such as an RF signal, with the first signaling pin 304 and the second signaling pin 308 possibly interfering with each other via interfering RF signals in the absence of a RF blocking/shielding metal post 132. Either the first signal pin 304 or the second signaling pin 308 may be implemented as a structure distinct from the metal posts 132 or may be implemented as a metal post 132, as described herein.

In some embodiments, the method 900 includes a step 916 of merging two or more metal posts 132 to increase RF shielding between the first signaling pin 304 and the second signaling pin 308 (e.g., and to increase thermal dissipation from the circuit substrate 108). The merging of the metal posts 132 may occur during the step 908 of placing the metal posts on the external surface 120, or may be formed after the placement process via additive manufacturing method, with merging of the metal posts 132 forming merged sets 136*a-f* as described herein.

In some embodiments, the method 900 includes a step 916 of coupling the package 104 to electronic componentry via one or more metal posts. For example, the package 104 may be coupled to one or more microprocessors 124 or RF components, may be coupled or integrated into a motherboard 808, and/or may be coupled to or integrated within an electronic device such as a mobile communication device 820. The coupling of the package 104 may include the physical interaction of one or more metal posts 132 with corresponding mounting structures located on the corresponding surfaces of the coupled component, such as solder balls or pads.

In some embodiments, the method 900 includes a step 920 of powering up a device integrated with the package 104. For example, the mobile communication device 820 integrated with the package 104 may be turned on. Power flowing through the circuit substrate 108 creates heat that is dissipated at a faster rate through the merged set 136 of metal posts 132 than through unmerged metal posts 132. RF signals flowing through the first signaling pin 304 and the second signaling pin 308 upon power-up create RF interferences that can potentially affect RF signal flow for either the first signaling pin 304 of the second signaling pin 308. These interferences are reduced via blocking/shielding by metal posts 132 placed between the first signaling pin 304 and the second interfering pin 308. This blocking/shielding ability is enhanced when two or more metal posts blocking/shielding the interfering signal are merged into a merged set 136.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A system comprising:
 a package comprising:
  a circuit substrate comprising:
   a dielectric layer;
   a first metal layer disposed upon a first side of the dielectric layer and having a first external surface; and
   a plurality of metal posts disposed on the first external surface comprising:
    a merged set of at least two metal posts configured to block interfering signals between a first signal pin and a second signal pin and to dissipate heat from the circuit substrate; and
    a mounting set of metal posts configured to mount the package.

2. The system of claim 1, further comprising:
 a second metal layer disposed on a second side of the dielectric layer; and
 internal circuitry configured to transmit electrical signals between the first metal layer and the second metal layer.

3. The system of claim 1, wherein the metal posts comprise copper.

4. The system of claim 1, wherein one or more metal posts of the plurality of metal posts are configured with a width within a range between 10 μm and 500 μm.

5. The system of claim 1, wherein one or more metal posts of the plurality of metal posts is configured with a width within a range between 40 μm and 200 μm.

6. The system of claim 1, wherein one or more metal posts of the plurality of metal posts is configured with a height within a range between 10 μm and 600 μm.

7. The system of claim 1, wherein one or more metal posts of the plurality of metal posts is configured with a height within a range between 30 μm and 200 μm.

8. The system of claim 1, wherein one or more metal posts of the plurality of metal posts is configured with a minimum length within a range between 30 μm and 100 μm.

9. The system of claim 1, wherein the merged set of metal posts is configured as an L-shape.

10. The system of claim 1, wherein the merged set of metal posts is configured as a cruciform shape.

11. The system of claim 1, wherein the merged set of metal posts is configured as a block shape.

12. The system of claim 1, wherein the merged set of metal posts is configured as a hollow block shape.

13. The system of claim 1, further comprising a transceiver, wherein the package is integrated within the transceiver.

14. The system of claim 1, further comprising a mobile communication device, wherein the package is integrated within the mobile communication device.

15. The system of claim 1, wherein upon an application of power to the circuit substrate, the merged set of metal posts demonstrates a thermal resistance of less than 42° C./W.

16. The system of claim 1, wherein the merged set of metal posts reduces interfering noise greater than 1 dB as compared to a similarly designed and operated non-merged set of metal posts.

17. A system comprising:
 a package comprising:
  a circuit substrate comprising:
   a dielectric layer;
   a first metal layer disposed upon a first side of the dielectric layer and configured with a first external surface;
   a second metal layer disposed on a second side of the dielectric layer; and
   internal circuitry configured to transmit electrical signals between the first metal layer and the second metal layer; and
   a plurality of metal posts disposed on the first external surface comprising:
    a merged set of at least two metal posts configured to block interfering signals between a first signal pin and a second signal pin and to dissipate heat from the circuit substrate, wherein the merged set; and
    a mounting set of metal posts configured to mount the package, wherein one or more metal posts of the plurality of metal posts are configured with a height within a range between 30 μm and 200 μm.

18. The system of claim 17, wherein the one or more metal posts of the plurality of metal posts are configured with a width within a range between 40 μm and 200 μm.

19. The system of claim 17, wherein the merged set is configured as an L shape.

20. A method for dissipating heat from a package and reducing interference between a first signaling pin and a second signaling pin comprising:
 preparing an external surface of a circuit substrate for placement of a plurality of metal posts;
 placing the plurality of metal posts on the external surface of a circuit substrate;
 forming a first signaling pin and a second signaling pin on the external surface;
 merging two or more metal posts of the plurality of metal posts to increase shielding between the first signaling pin and the second signaling pin and increase thermal dissipation from the circuit substrate; and
 coupling the package to electronic componentry via one or more of the plurality of metal posts.

* * * * *

UNITED STATES PATENT AND TRADEMARK OFFICE
CERTIFICATE OF CORRECTION

| | | |
|---|---|---|
| PATENT NO. | : 11,723,143 B1 | Page 1 of 1 |
| APPLICATION NO. | : 17/730856 | |
| DATED | : August 8, 2023 | |
| INVENTOR(S) | : Chang Kyu Choi et al. | |

It is certified that error appears in the above-identified patent and that said Letters Patent is hereby corrected as shown below:

In the Claims

Column 12, Claim 17, Lines 31 and 32:
Change: heat from the circuit substrate, wherein the merged set; and
To: heat from the circuit substrate; and Signed and Sealed this
Fourth Day of February, 2025

Coke Morgan Stewart
*Acting Director of the United States Patent and Trademark Office*